United States Patent
Mori et al.

(10) Patent No.: US 10,175,279 B2
(45) Date of Patent: Jan. 8, 2019

(54) METHOD OF DERIVING S PARAMETER OF ELECTRIC CIRCUIT NETWORK

(71) Applicant: MURATA MANUFACTURING CO., LTD., Kyoto-fu (JP)

(72) Inventors: Taichi Mori, Nagaokakyo (JP); Satoshi Kageyama, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 235 days.

(21) Appl. No.: 15/255,544

(22) Filed: Sep. 2, 2016

(65) Prior Publication Data
US 2016/0370412 A1 Dec. 22, 2016

Related U.S. Application Data

(63) Continuation of application No. PCT/JP2015/054338, filed on Feb. 17, 2015.

(30) Foreign Application Priority Data

Mar. 4, 2014 (JP) .................................. 2014-041165

(51) Int. Cl.
*G01R 27/32* (2006.01)
*G01R 35/00* (2006.01)

(52) U.S. Cl.
CPC ............. *G01R 27/32* (2013.01); *G01R 35/00* (2013.01)

(58) Field of Classification Search
None
See application file for complete search history.

(56) References Cited

U.S. PATENT DOCUMENTS 5,784,299 A * 7/1998 Evers ..................... G01R 27/28
324/601

FOREIGN PATENT DOCUMENTS

| JP | 2003-294794 A | 10/2003 |
| JP | 3558086 B1 | 8/2004 |
| JP | 2004-317506 A | 11/2004 |
| JP | 2004-354145 A | 12/2004 |

(Continued)

OTHER PUBLICATIONS

International Search Report issued in PCT/JP2015/054338; dated Apr. 7, 2015.

(Continued)

*Primary Examiner* — Paresh H Patel
(74) *Attorney, Agent, or Firm* — Studebaker Brackett PC

(57) ABSTRACT

A first S parameter of a first circuit network including an input port and a connection port is prepared, a second S parameter of a second circuit network is measured, and an overall S parameter of an overall circuit network is calculated. The S parameter of the overall circuit network is calculated as the overall S parameter corresponding to the input port among virtual S parameters of a virtual overall circuit network in which the connection port of the virtual first circuit network is connected with the second circuit network, by using, as an unknown value, a parameter corresponding to the dummy port among virtual T parameters of a virtual first circuit network obtained through conversion of the first circuit network into a symmetric circuit network by adding a dummy port to the input port side of the first circuit network.

2 Claims, 7 Drawing Sheets

(56) References Cited

FOREIGN PATENT DOCUMENTS

JP            4009876 B2    11/2007
JP            5246172 B2    7/2013

OTHER PUBLICATIONS

Written Opinion issued in PCT/JP2015/054338; dated Apr. 7, 2015.
Hunton, J. K.; "Analysis of Microwave Measurement Techniques by Means of Signal Flow Graphs"; IRE Transactions on Microwave Theory and Techniques; Mar. 1960; pp. 206-212; vol. 8; Issue 2.
Frei, James et al.; "Multiport S-Parameter and T-Parameter Conversion With Symmetry Extension"; IEEE Transactions on Microwave Theory and Techniques; Nov. 2008; pp. 2493-2504; vol. 56; Issue 11; IEEE.

\* cited by examiner

FIG.3 ( a )
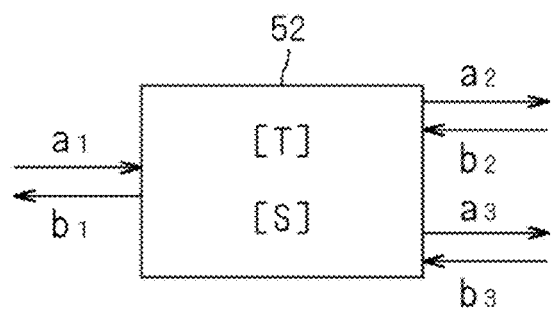
FIG.3 ( b )
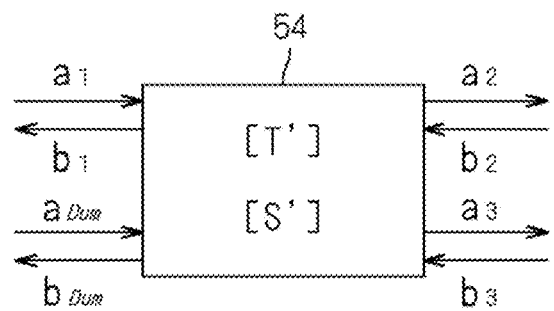

--Prior Art--

METHOD OF DERIVING S PARAMETER OF ELECTRIC CIRCUIT NETWORK

CROSS REFERENCE TO RELATED APPLICATIONS

This application claims benefit of priority to Japanese Patent Application 2014-041165 filed Mar. 4, 2014, and to International Patent Application No. PCT/JP2015/054338 filed Feb. 17, 2015, the entire content of which is incorporated herein by reference.

TECHNICAL FIELD

The present disclosure relates to a method of deriving an S parameter of an electric circuit network.

BACKGROUND

Conventionally, the electric property of an electric component such as a surface-mount electric component that does not include a coaxial connector has been measured while the electric component is mounted on a measurement jig including a coaxial connector and a coaxial cable connects the measurement jig and a measurement device. In such a measurement, a measurement error in electric property is caused by variation in property between individual measurement jigs as well as variation in property between individual coaxial cables and measurement devices.

Measurement of the coaxial cable and the measurement device is performed while the measurement device is connected with a standard having a reference property through the coaxial cable. This allows identification of an error occurring between the head of the coaxial cable connected with the standard and the measurement device.

However, for the measurement jig, it is impossible to accurately identify an error in electric property between a connection terminal in a part at which the electric component is mounted and the coaxial connector for connecting the coaxial cable. It is also difficult to adjust measurement jigs to have identical properties. In particular, it is significantly difficult to adjust measurement jigs to have identical properties over a wide bandwidth.

To solve these problems, what is called a relative error correction method has been disclosed that performs measurement while a correction data acquisition specimen is mounted on a plurality of measurement jigs to previously derive, from variation in measurement values between the measurement jigs, an expression for correcting a relative error between a measurement jig (hereinafter referred to as a "reference jig") and another measurement jig (hereinafter referred to as a "test jig"), and calculates, for the electric property of an optional electric component, using the expression from a measurement value (test jig measurement value) measured while the electric component is mounted on the test jig, an estimation value of a measurement value (test jig measurement value) measured while the electric component is mounted on the reference jig.

For example, as illustrated in FIG. 10, Estimation Value $S_{D3\times3}$ can be calculated through an overall circuit network $20a$ in which a first circuit network $32a$ representing Expression $CA_{6\times6}$ and a second circuit network $30a$ representing Measurement Value $S_{T3\times3}$ are connected with each other for correction (for example, refer to Japanese Patent No. 3558086, Japanese Patent No. 4009876 and Japanese Patent No. 5246172).

Typically, Mason's method that performs calculation by representing the circuit networks with S parameters is used to accurately calculate a result of connecting circuit networks (for example, refer to Hunton, J. K., "Analysis of Microwave Measurement Techniques by Means of Signal Flow Graphs", IEEE Transactions on Microwave Theory and Techniques, vol. 8, issue 2, p. 206-212).

A method involving simple matrix calculation using T parameters is known as one of the most typical methods for performing fast circuit network connection calculation, (for example, refer to Frei, J.; Cai, Xiao-Ding; Muller, S., "Multiport S-Parameter and T-Parameter Conversion With Symmetry Extension", IEEE Transactions on Microwave Theory and Techniques, vol. 56, issue 11, p. 2493-2504).

SUMMARY

Problem to be Solved by the Disclosure

For example, as illustrated in FIG. 1, when calculation is performed for an overall circuit network 56 in which an asymmetric circuit network 52 in which the number of input ports and the number of connection ports are different from each other is connected with a circuit network 2 as a DUT, the conventional technology has the following problems.

Mason's method can accurately calculate an overall circuit network including an asymmetric circuit network, which is an advantage. However, the calculation takes a long time, which is a disadvantage.

A method involving simple matrix calculation using T parameters cannot obtain an accurate calculation result when the number of input ports and the number of connection ports are different from each other (a T parameter under such a condition is referred to as an "unbalance T parameter").

The present disclosure provides a method of deriving an S parameter of an electric circuit network that can accurately calculate, in a short time, an S parameter of an overall circuit network including an asymmetric circuit network.

Means for Solving the Problem

To solve the problem, the present disclosure provides a method of deriving an S parameter of an electric circuit network that is configured as follows.

A method of deriving an S parameter of an electric circuit network includes (i) a first step of preparing one of a first S parameter and a first T parameter of a first circuit network including an input port and a connection port, (ii) a second step of measuring an S parameter of a second circuit network, and (iii) a third step of calculating, by using one of the first S parameter and the first T parameter prepared in the first step and the second S parameter measured in the second step, an S parameter of an overall circuit network in which the connection port of the first circuit network is connected with the second circuit network. The first circuit network is an asymmetric circuit network in which the number of the input ports is smaller than the number of the connection ports. The third step calculates, on an assumption of a virtual first circuit network obtained through conversion of the first circuit network into a symmetric circuit network by adding a dummy port to the input port side of the first circuit network, the overall S parameter corresponding to the input port among virtual S parameters of a virtual overall circuit network in which the connection port of the virtual first circuit network is connected with the second circuit network, as the overall S parameter of the overall circuit network by using a parameter corresponding to the dummy port among virtual T parameters of the virtual first circuit network as an unknown value.

In the above-described method, the calculation of the overall S parameter of the overall circuit network in which the first circuit network is connected with the second circuit network allows correction of a measurement value of the second S parameter of the second circuit network by using the first circuit network. Since the virtual first circuit network is a symmetric circuit network, the overall S parameter of the overall circuit network can be calculated in a short time by using the parameter corresponding to the dummy port among the virtual T parameters of the virtual first circuit network. In addition, the overall S parameter corresponding to the input port among the virtual S parameters of the virtual overall circuit network can be accurately calculated.

In order to solve the above-described problem, the present disclosure provides a method of deriving an S parameter of an electric circuit network that is configured as follows.

A method of deriving an S parameter of an electric circuit network includes (i) a first step of preparing one of a first S parameter and a first T parameter of a first circuit network including an input port and a connection port, (ii) a second step of measuring a second S parameter of a second circuit network, and (iii) a third step of calculating, by using one of the first S parameter and the first T parameter prepared in the first step and the second S parameter of the second circuit network measured in the second step, an overall S parameter of an overall circuit network in which the connection port of the first circuit network is connected with the second circuit network. The first circuit network is an asymmetric circuit network in which the number of the input ports is larger than the number of the connection ports. The third step calculates, on an assumption of a virtual first circuit network obtained through conversion of the first circuit network into a symmetric circuit network by adding a first dummy port to the connection port side of the first circuit network, and a virtual second circuit network obtained by adding a second dummy port connected with the first dummy port to the second circuit network, the overall S parameter corresponding to the input port among virtual S parameters of a virtual overall circuit network in which the connection port of the virtual first circuit network and the first dummy port are connected with the virtual second circuit network, as the overall S parameter of the overall circuit network by using a virtual T parameter of the virtual first circuit network as an unknown value and setting zero to a parameter corresponding to the second dummy port among virtual S parameters of the virtual second circuit network.

In the above-described method, the calculation of the overall S parameter of the overall circuit network in which the first circuit network is connected with the second circuit network allows correction of a measurement value of the second S parameter of the second circuit network by using the first circuit network. Since the virtual first circuit network is a symmetric circuit network, the overall S parameter of the overall circuit network can be calculated in a short time by using the T parameter of the virtual first circuit network. In addition, the overall S parameter of the overall circuit network can be accurately calculated by setting zero to the parameter corresponding to the second dummy port among the virtual S parameters of the virtual second circuit network.

Advantageous Effect of the Disclosure

The present disclosure can convert an asymmetric circuit network into a symmetric circuit by adding a dummy port to the asymmetric circuit network so as to accurately calculate by using a T parameter of the symmetric circuit, in a short time, an S parameter of an overall circuit network including the asymmetric circuit network.

BRIEF DESCRIPTION OF THE DRAWINGS

FIG. 3(a) is a circuit block diagram of the first circuit network, and FIG. 3(b) is a circuit block diagram of the virtual first circuit network. (Calculation Example 1)

DETAILED DESCRIPTION

Figure 1:
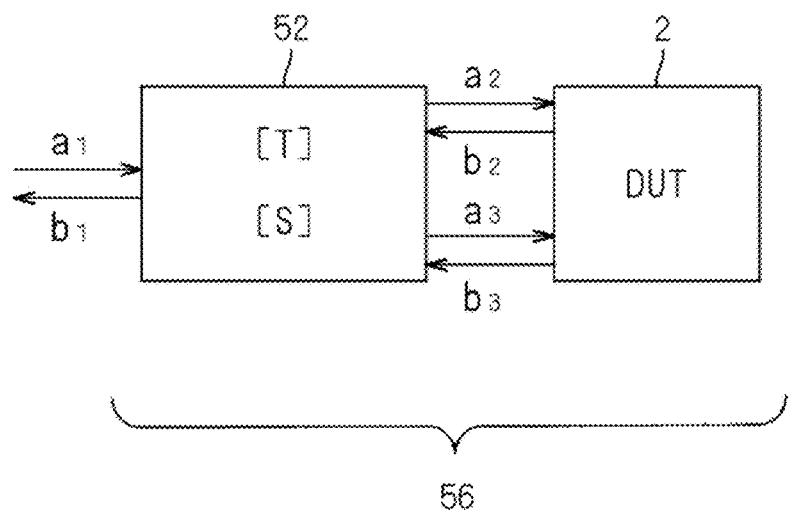
FIG. 1 is a circuit block diagram illustrating that a first circuit network is connected with a second circuit network. (Calculation Example 1)

An embodiment of the present disclosure will be described below with reference to FIGS. 1 to 9.

Outline of the present disclosure will be described first. A method of deriving an S parameter of an electric circuit network includes (i) a first step of preparing one of a first S parameter and a first T parameter of a first circuit network including an input port and a connection port, (ii) a second step of measuring a second S parameter of a second circuit network, and (iii) a third step of calculating an overall S parameter of an overall circuit network in which the connection port of the first circuit network is connected with the second circuit network by using the first S parameter prepared in the first step and the second S parameter of the second circuit network measured in the second step. The first circuit network is an asymmetric circuit network in which the number of input ports and the number of connection ports are different from each other.

In this case, the overall S parameter of the overall circuit network can be accurately calculated by using the first S parameter of the first circuit network as an asymmetric circuit network, but the calculation takes a long time. Use of the first T parameter achieves a shorter calculation time as compared to a case in which the first S parameter is used. However, accurate calculation is impossible with a T parameter of an asymmetric circuit network, in other words, an unbalance T parameter.

For this reason, the present disclosure calculates, by using a virtual T parameter of a virtual first circuit network obtained through conversion of the first circuit network into a symmetric circuit network by adding a dummy port to the input port side (or the connection port side) of the first circuit network as an asymmetric circuit network, the overall S parameter corresponding to the overall circuit network in which the first circuit network is connected with the second circuit network among virtual S parameters of a virtual overall circuit network in which the virtual first circuit network is connected with the second circuit network (or a virtual second circuit network obtained by adding a dummy port to the second circuit network). In this calculation, a circuit network parameter related to the dummy port is treated as an unknown value. A signal related to a calculation result of the overall circuit network is not affected by setting a parameter corresponding to the dummy port among the virtual T parameters to be unknown and setting a parameter corresponding to the dummy port among the virtual S parameters to be zero.

Such a conversion of an asymmetric circuit network into a symmetric circuit network allows derivation of an accurate calculation result with T parameters, which can be calculated fast. This achieves, for example, speeding up of simulation calculation, speeding up of property selection in mass production process, and high efficiency of designing in research and development using an asymmetric circuit network.

The following describes Calculation Examples 1 to 3.

Calculation Example 1

Calculation Example 1 with one input port and two connection ports will be described with reference to circuit block diagrams in FIGS. 1 to 3.

As illustrated in FIG. 1, the first circuit network 52 is an asymmetric circuit network including one input port and two connection ports, with the input port referred to as Port 1, and the connection ports referred to as Port 2 and Port 3. The connection ports of the first circuit network 52 are connected with two ports of the second circuit network 2. In FIG. 1, $a_i$ and $b_i$ (i=1, 2, 3) represent signals through Port i.

The second circuit network 2 is a measurement value of a DUT (specimen), and the first circuit network 52 is a circuit network for correcting error in the measurement value of the DUT (specimen). In other words, a corrected value of the measurement value of the DUT can be obtained through the overall circuit network 56 in which the first circuit network 52 and the second circuit network 2 are connected with each other.

Calculation of the overall S parameter of the overall circuit network 56 using the first S parameter of the first circuit network 52 as an asymmetric circuit network is complicated and takes a long time. To avoid this, the virtual first circuit network 54 is introduced that is obtained through conversion of the first circuit network 52 illustrated in FIG. 3(a) into a symmetric circuit network by adding a dummy port to the input port side as illustrated in FIG. 3(b).

Figure 2:
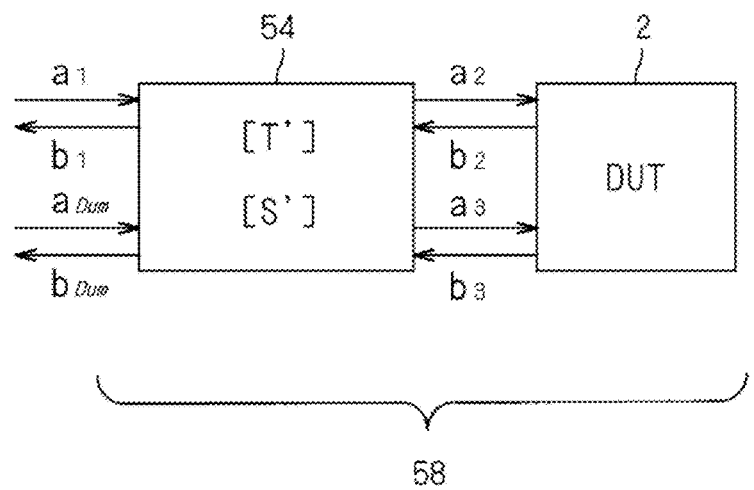
FIG. 2 is a circuit block diagram illustrating that a virtual first circuit network is connected with a second circuit network. (Calculation Example 1)
Figure 4:
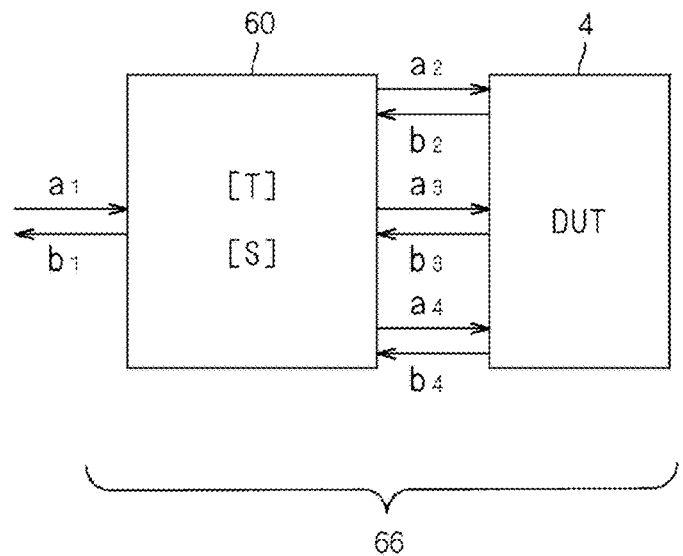
FIG. 4(a) is a circuit block diagram illustrating that the first circuit network is connected with the second circuit network.
FIG. 4(b) is a circuit block diagram illustrating that the virtual first circuit network is connected with the second circuit network. (Calculation Example 2)
Figure 4:
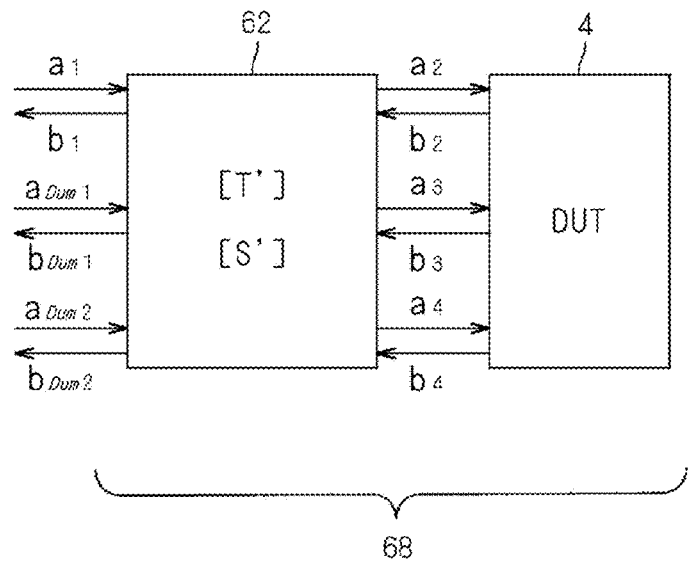

As illustrated in FIG. 2, virtual S parameters of the virtual overall circuit network 58 in which the virtual first circuit network 54 and the second circuit network 2 are connected with each other can be calculated in a short time by using virtual T parameters of the virtual first circuit network 54. The overall S parameter of the overall circuit network 56 in FIG. 1 can be calculated from the S parameter corresponding to the input port of the virtual first circuit network 54 among the virtual S parameters of the virtual overall circuit network 58. The specific description will be made on this calculation below.

The first circuit network 52 can be represented by Expression 1 below using the first S parameters.

Expression 1

$$\begin{pmatrix} b_1 \\ a_2 \\ a_3 \end{pmatrix} = \begin{pmatrix} S_{11} & S_{12} & S_{13} \\ S_{21} & S_{22} & S_{23} \\ S_{31} & S_{32} & S_{33} \end{pmatrix} \begin{pmatrix} a_1 \\ b_2 \\ b_3 \end{pmatrix}$$

Expression 2 below is an example of substitution of values into Expression 1.

Expression 2

$$\begin{pmatrix} b_1 \\ a_2 \\ a_3 \end{pmatrix} = \begin{pmatrix} 0.1 & 0.9 & 0 \\ 0.9 & 0.1 & 0 \\ 0 & 0 & -0.9 \end{pmatrix} \begin{pmatrix} a_1 \\ b_2 \\ b_3 \end{pmatrix}$$

In Expression 1, $S_{31}$, $S_{32}$, $S_{13}$, and $S_{23}$ are set to zero to facilitate a calculation check but not to set a special condition for applying the present disclosure.

The S parameters of the virtual first circuit network 54 are obtained by adding the S parameters of the dummy port to Expression 2 as indicated by Expression 3 below.

Expression 3

$$\begin{pmatrix} b_1 \\ b_{Dum} \\ a_2 \\ a_3 \end{pmatrix} = \begin{pmatrix} 0.1 & S_{SDum11} & 0.9 & 0 \\ S_{DumS11} & S_{DumDum11} & S_{DumS12} & S_{DumS13} \\ 0.9 & S_{SDum21} & 0.1 & 0 \\ 0 & S_{SDum31} & 0 & -0.9 \end{pmatrix} \begin{pmatrix} a_1 \\ a_{Dum} \\ b_2 \\ b_3 \end{pmatrix}$$

Expression 4 below is obtained by converting Expression 3 into T parameters. A conversion expression for converting S parameters of a symmetric circuit network into T parameters is disclosed in, for example, Japanese Patent No. 5246172.

Expression 4

$$\begin{pmatrix} b_1 \\ b_{Dum} \\ a_1 \\ a_{Dum} \end{pmatrix} = \begin{pmatrix} 0.89 & \frac{0.90 * S_{SDum11} - 0.10 * S_{SDum21}}{S_{SDum31}} & 0.11 & \frac{S_{SDum11} - 0.11 * S_{SDum21}}{S_{SDum31}} \\ -0.11 * S_{DumS11} + S_{DumS12} & S_{DumS13} + \frac{0.90 * S_{DumDum11} - S_{DumS11} * S_{SDum21}}{S_{SDum31}} & 1.11 * S_{DumS11} & \frac{S_{DumDum11} - 1.11 * S_{DumS11} * S_{SDum21}}{S_{SDum31}} \\ -0.11 & \frac{S_{SDum21}}{S_{SDum31}} & 1.11 & -\frac{1.11 * S_{SDum21}}{S_{SDum31}} \\ 0 & \frac{0.90}{S_{SDum31}} & 0 & \frac{1}{S_{SDum31}} \end{pmatrix} \begin{pmatrix} a_2 \\ a_3 \\ b_2 \\ b_3 \end{pmatrix}$$

Expression 5 below is used as exemplary second S parameters of the second circuit network 2.

Expression 5

$$\begin{pmatrix} b_2 \\ b_3 \end{pmatrix} = \begin{pmatrix} 0.1 & 0.9 \\ 0.9 & 0.1 \end{pmatrix} \begin{pmatrix} a_2 \\ a_3 \end{pmatrix}$$

The virtual overall circuit network 58 in which the virtual first circuit network 54 represented by the virtual T parameters in Expression 4 is connected with the second circuit network 2 represented by the second S parameters in Expression 5 is represented by Expression 6 below through a calculation method disclosed in Japanese Patent No. 5246172.

Expression 6

$$\begin{pmatrix} b_1 \\ b_c \end{pmatrix} = \begin{pmatrix} -0.34 & \begin{matrix} S_{SC11} - 0.48 * S_{SC21} + \\ 0.70 * S_{SC31} \end{matrix} \\ \begin{matrix} S_{CS11} - 0.48 * S_{CS12} + \\ 0.70 * S_{CS13} \end{matrix} & \begin{matrix} S_{CC11} - 0.54 * S_{CS12} * S_{CS21} + \\ 0.78 * S_{CS13} * S_{CS21} + \\ 0.78 * S_{CS12} * S_{SC31} \end{matrix} \end{pmatrix} \begin{pmatrix} a_1 \\ a_c \end{pmatrix}$$

The 2×2 matrix in the left part of the right-hand side of Expression 6 represents a set of the virtual S parameters of the virtual overall circuit network 58. Among these virtual S parameters, $S_{11}$ related to a signal (a1, b1) is the only virtual S parameter corresponding to the input port of the first circuit network 52, and the overall S parameter of the overall circuit network 56 obtains Expression 7 below without being affected by the dummy port.

Expression 7

$$S_{11} = -0.34$$

Calculation by Mason's method obtains the same result as Expression 7. This indicates that accurate circuit network calculation can be performed by adding a dummy port to an asymmetric circuit network so as to obtain a symmetric circuit network, and using virtual T parameters.

In a method using unbalance T parameters disclosed in Frei, J.; Cai, Xiao-Ding; Muller, S., "Multiport S-Parameter and T-Parameter Conversion With Symmetry Extension", IEEE Transactions on Microwave Theory and Techniques, vol. 56, issue 11, p. 2493-2504, however, calculation obtains a result of Expression 8 below, which indicates that the calculation cannot be accurately performed.

Expression 8

$$S_{11} = -0.11$$

Calculation Example 2

Calculation Example 2 with one input port and three connection ports will be described with reference to circuit block diagrams in FIGS. 4(a) and 4(b).

As illustrated in FIG. 4(a), the first circuit network 60 is an asymmetric circuit network including one input port and three connection ports. The connection ports of the first circuit network 60 are connected with three ports of a second circuit network 4. The overall S parameters of an overall circuit network 66 in which the first circuit network 60 is connected with the second circuit network 4 can be obtained by calculating the virtual S parameters of a virtual overall circuit network 68 in which connection ports of a virtual first circuit network 62 obtained through conversion of the first circuit network 60 into a symmetric circuit network by adding two dummy ports to the input port side of the first circuit network 60 as illustrated in FIG. 4(b) are connected with the three ports of the second circuit network 4, by using the virtual T parameters of the virtual first circuit network 62.

For example, the first S parameters of the first circuit network 60 are set to values indicated by Expression 9.

Expression 9

$$\begin{pmatrix} b_1 \\ a_2 \\ a_3 \\ a_4 \end{pmatrix} = \begin{pmatrix} 0.1 & 0.9 & 0 & 0 \\ 0.9 & 0.1 & 0 & 0 \\ 0 & 0 & 0.9 & 0 \\ 0 & 0 & 0 & -0.9 \end{pmatrix} \begin{pmatrix} a_1 \\ b_2 \\ b_3 \\ b_4 \end{pmatrix}$$

Expression 10 below indicates the S parameters of the virtual first circuit network 62 obtained through conversion of the first circuit network 60 into a symmetric circuit network by adding two dummy ports to the input port side of the first circuit network 60.

Expression 10

$$\begin{pmatrix} b_1 \\ b_{Dum1} \\ b_{Dum2} \\ a_2 \\ a_3 \\ a_4 \end{pmatrix} = \begin{pmatrix} 0.1 & S_{SDum11} & S_{SDum12} & 0.9 & 0 & 0 \\ S_{DumS11} & S_{DumDum11} & S_{DumDum12} & S_{DumS12} & S_{DumS13} & S_{DumS14} \\ S_{DumS21} & S_{DumDum21} & S_{DumDum22} & S_{DumS22} & S_{DumS23} & S_{DumS24} \\ 0.9 & S_{SDum21} & S_{SDum22} & 0.1 & 0 & 0 \\ 0 & S_{SDum31} & S_{SDum32} & 0 & 0.9 & 0 \\ 0 & S_{SDum41} & S_{SDum42} & 0 & 0 & -0.9 \end{pmatrix} \begin{pmatrix} a_1 \\ a_{Dum1} \\ a_{Dum2} \\ b_2 \\ b_3 \\ b_4 \end{pmatrix}$$

Similarly to Calculation Example 1, the virtual S parameters of the virtual overall circuit network 68 are calculated by using virtual T parameters obtained by converting the S parameters in Expression 10 so that the S parameter corresponding to the input port of the first circuit network 52 is obtained among the virtual S parameters. This calculation obtains a result of Expression 11 below without being affected by parameters of the dummy ports.

Expression 11

$$S_{11} = 0.17 \quad \text{Expression 11}$$

Calculation by Mason's method obtains the same result as Expression 11, which indicates the above-described calculation is accurate.

When the number of input ports is smaller than the number of connection ports in the first circuit network as in Calculation Examples 1 and 2, the virtual first circuit network is introduced in which dummy ports are added to the input port side of the first circuit network so that the number of ports on the input port side is equal to the number of connection ports. The overall S parameter of the overall circuit network in which the connection port of the first circuit network is connected with the second circuit network is identical to the S parameter corresponding to an input port among the virtual S parameters of the virtual overall circuit network in which the virtual first circuit network and the second circuit network are connected with each other. The S parameter corresponding to the input port among the virtual S parameters of the virtual overall circuit network can be accurately calculated in a short time by using the virtual T parameters of the virtual first circuit network as a symmetric circuit network. Accordingly, the calculation is applicable to a circuit network including any number of ports through the processes in Calculation Examples 1 and 2.

Calculation Example 3

Figure 5:
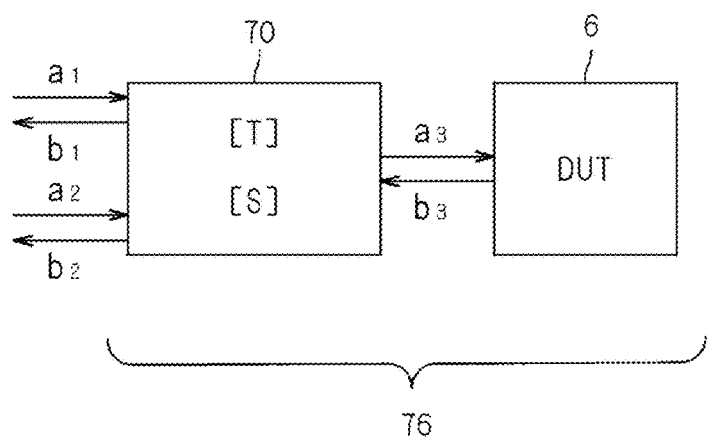
FIG. 5(a) is a circuit block diagram illustrating that the first circuit network is connected with the second circuit network.
FIG. 5(b) is a circuit block diagram illustrating that the virtual first circuit network is connected with a virtual second circuit network. (Calculation Example 3)
Figure 5:
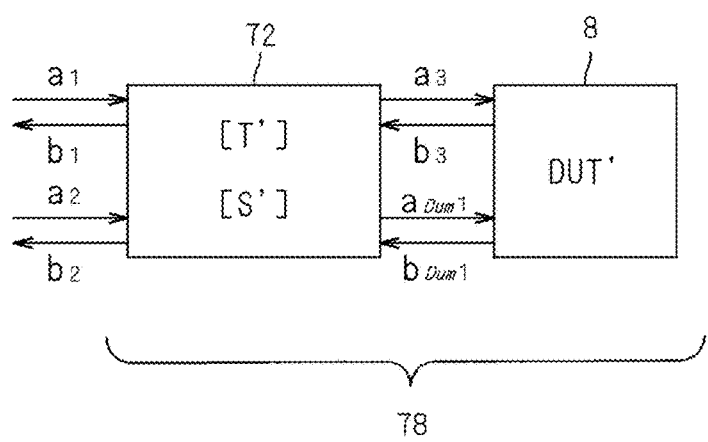

Calculation Example 3 in which the number of input ports is larger than the number of connection ports in the first circuit network will be described with reference to block diagrams in FIG. 5.

As illustrated in FIG. 5(a), a first circuit network 70 is an asymmetric circuit network including two input ports and one connection port. The connection port of the first circuit network 70 is connected with a second circuit network 6. The overall S parameter of an overall circuit network 76 in which the first circuit network 70 is connected with the second circuit network 6 can be obtained from the virtual S parameters of a virtual overall circuit network 78 in which a virtual first circuit network 72 and a virtual second circuit network 8 are connected with each other as illustrated in FIG. 5(b). The virtual first circuit network 72 is obtained through conversion of the first circuit network 70 into a symmetric circuit network by adding one dummy port to the connection port side of the first circuit network 70. The virtual second circuit network 8 is obtained by adding, to the second circuit network 6, a dummy port corresponding to the dummy port of the virtual first circuit network 72. In the virtual overall circuit network 78, the connection port of the virtual first circuit network 72 and the connection port of the virtual second circuit network 8 are connected with each other, and the dummy port of the virtual first circuit network 72 and the dummy port of the virtual second circuit network 8 are connected with each other.

In processing performed only when the number of input ports is larger than the number of connection ports in the first circuit network 70, the S parameter of the second circuit network 6 connected with the first circuit network 70 needs to be changed. In a case of the asymmetric circuit network in FIGS. 5(a) and 5(b), since the second circuit network 6 is a one-port device, the value of the S parameter is given by Expression 12.

Expression 12

$$b_3 S_{11} \cdot a_3 \quad \text{Expression 12}$$

As illustrated in FIG. 5(b), when the second circuit network 6 is changed into the virtual second circuit network 8 as a symmetric circuit network, the values of S parameters related to dummy ports among the S parameters of the virtual second circuit network 8 are set to zero as indicated by Expression 13 below so that the virtual second circuit network 8 is represented as a two-port device.

Expression 13

$$\begin{pmatrix} b_3 \\ b_{Dum1} \end{pmatrix} = \begin{pmatrix} S_{11} & S_{DumS11} \\ S_{SDum11} & S_{DumDum11} \end{pmatrix} \begin{pmatrix} a_3 \\ a_{Dum1} \end{pmatrix} = \begin{pmatrix} S_{11} & 0 \\ 0 & 0 \end{pmatrix} \begin{pmatrix} a_3 \\ a_{Dum1} \end{pmatrix} \quad \text{Expression 13}$$

Accordingly, similarly to Calculation Examples 1 and 2 in which the number of input ports is smaller than the number of connection ports in the first circuit network, in subsequent calculation, the overall S parameters of the overall circuit network 76 can be calculated in a short time by using the virtual T parameters of the virtual first circuit network 72 because the virtual first circuit network 72 is a symmetric circuit network. In addition, the overall S parameters of the overall circuit network 76 can be accurately calculated by setting zero to a parameter corresponding to a second dummy port among the virtual S parameters of the virtual second circuit network 8.

Experiment Example 1

Experiment Example 1 in which the present disclosure is applied to a relative error correction method will be described with reference to FIGS. 6 to 9.

The relative error correction method calculates the S parameters of an overall circuit network in which a first circuit network called a relative error correction adapter that corrects a relative error between a reference jig and a test jig, and a second circuit network indicating a measurement value measured by using the test jig are connected with each other, and obtains a measurement value (estimation value) that would be obtained by measuring, using the reference jig, a specimen measured using the test jig.

FIG. 6(a) is an explanatory diagram of the reference jig 10. As illustrated in FIG. 6(a), the reference jig 10 includes a mounting unit 14 and two coaxial connectors 11 and 12. An electric component including two signal terminals and one GND terminal is mounted on the mounting unit 14. The signal terminals of the electric component are each a terminal of a signal line port connected with a signal line related to application or detection of a high frequency signal. The GND terminal of the electric component is a terminal of a non-signal line port other than the signal line ports. The mounting unit 14 is provided with two signal line connection terminals 15 and 16 electrically connected with the two signal terminals of the electric component and a non-signal line connection terminal 17 electrically connected with the GND terminal of the electric component. The coaxial connectors 11 and 12 are electrically connected with the signal line connection terminals 15 and 16, respectively. The non-signal line connection terminal 17 is connected with GND. The electric property of the electric component is measured in a state (referred to as a "reference state") in which the coaxial connectors 11 and 12 at Ports 1 and 2 of the reference jig 10 are connected with a network analyzer through a coaxial cable and the electric component is mounted on and connected with the mounting unit 14 of the reference jig 10. A measurement value measured in this manner includes error attributable to the reference jig 10.

Figure 6:
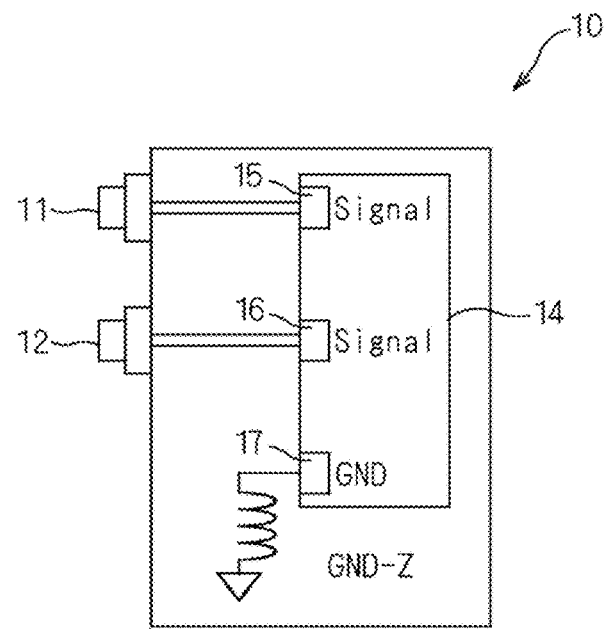
FIG. 6(a) is an explanatory diagram of a reference jig.
FIG. 6(b) is an explanatory diagram of a test jig. (Experiment Example 1)
Figure 6:
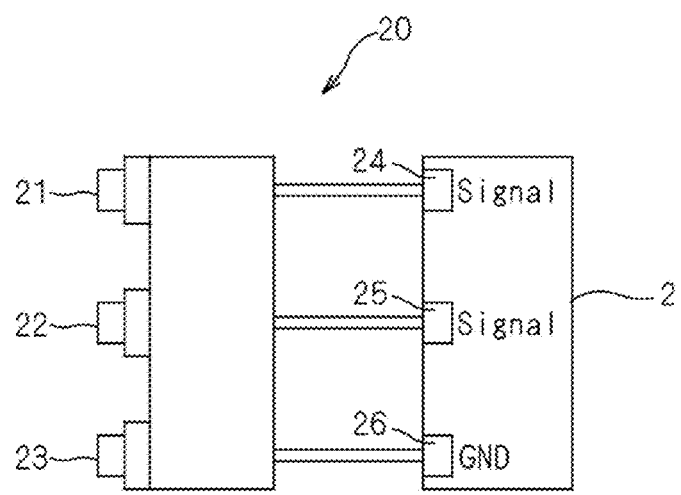

FIG. 6(*b*) is an explanatory diagram of the test jig 20. As illustrated in FIG. 6(*b*), the test jig 20 includes two signal line connection terminals 24 and 25 electrically connected with the two signal terminals of the electric component, a non-signal line connection terminal 26 electrically connected with the one GND terminal of the electric component, and coaxial connectors 21, 22, and 23 electrically connected with the two signal line connection terminals 24 and 25 and the non-signal line connection terminal 26. The electric property of the electric component is measured in a state (referred to as a "test state") in which the connection terminals 24, 25, and 26 at Ports 1, 2, and 3 of the test jig 20 are connected with the network analyzer through coaxial cables, and the electric component is connected with the connection terminals 24, 25, and 26 of the test jig 20. A measurement value measured in this manner includes error attributable to the test jig 20.

In the measurement states in FIG. 6, a measurement value (estimation value) that would be obtained by measuring, using the reference jig 10, a specimen measured using the test jig 20 is calculated by the relative error correction method. In this example, the relative correction adapter, in other words, the first circuit network is an asymmetric circuit including two input ports and three connection ports.

Figure 7:
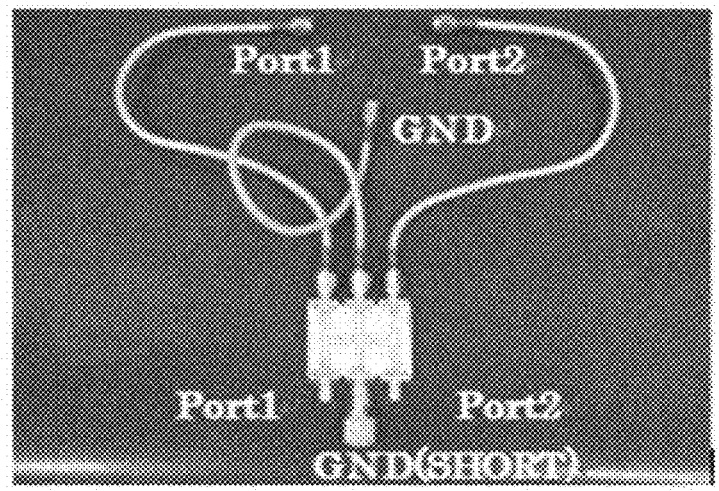
FIG. 7 is a picture of the reference jig. (Experiment Example 1)
Figure 8:
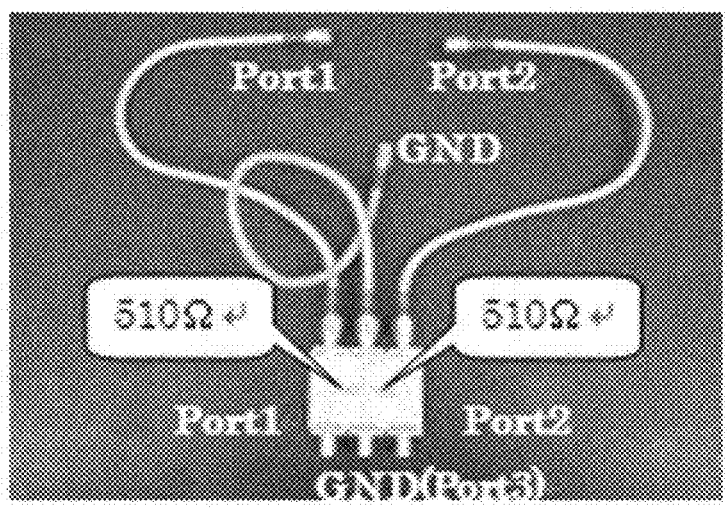
FIG. 8 is a picture of the test jig. (Experiment Example 1)
Figure 9:
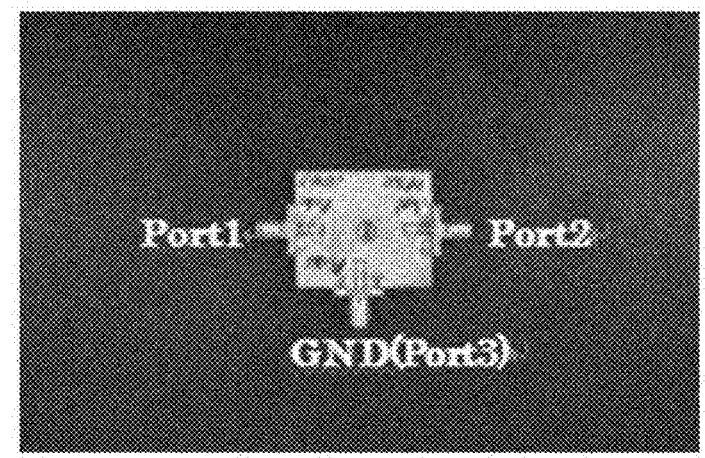
FIG. 9 is a picture of a standard specimen. (Experiment Example 1)
Figure 10:
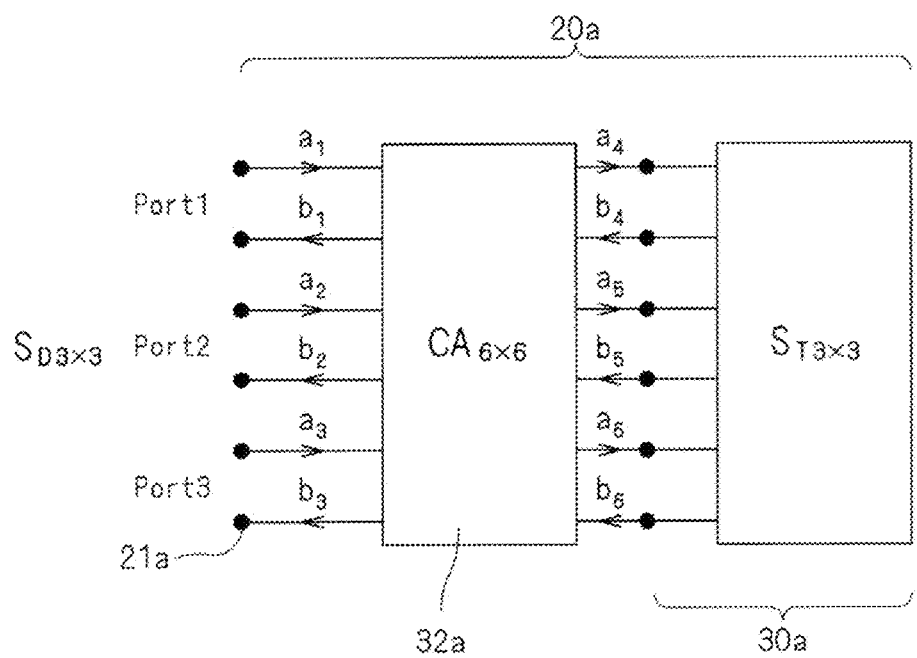
FIG. 10 is a block diagram of a relative error correction method. (Conventional Example)

The two measurement states (the reference state and the test state) in which GND terminals on scratchbuilt substrates have different impedances were configured to check that the calculation on an asymmetric circuit network can be performed fast by the method according to the present disclosure. FIG. 7 is a picture of the reference jig. FIG. 8 is a picture of the test jig. FIG. 9 is a picture of a standard specimen.

As illustrated in FIG. 7, the GND port of the reference jig was set to SHORT. As illustrated in FIG. 8, in the test jig, a resistance of 510Ω was connected between Port 1 and GND and between Port 2 and GND so as to degrade isolation as compared to the reference jig in FIG. 6. As illustrated in FIG. 9, the standard specimen includes three ports of Port 1, Port 2, and GND.

Seven three-port standard specimens listed in Table 1 below were prepared as scratchbuilt substrates. Values of the standard specimen were unknown. Only measurement values of the standard specimen in the reference state and the test state were used to calculate the S parameters of the relative correction adapter. In other words, the S parameters of the first circuit network were prepared.

TABLE 1

| Standard specimen properties | | | |
|---|---|---|---|
| No. | Port 1 | Port 2 | Port 3 (GND) |
| 1 | OPEN | SHORT | LOAD |
| 2 | LOAD | OPEN | LOAD |
| 3 | SHORT | LOAD | LOAD |
| 4 | SHORT | OPEN | LOAD |
| 5 | THRU | THRU | LOAD |
| 6 | LOAD | OPEN | SHORT |
| 7 | THRU | THRU | THRU |

The following lists other experiment conditions.

(Measurement device) E5071C (manufactured by Agilent Technologies)
(The number of measurement ports) two ports for the reference jig, and three ports for the test jig
(Measurement frequency) 60 MHz to 6 GHz
(The number of measurement points) 1601 points
(Intermediate frequency) 1 kHz
(DUT) scratchbuilt substrate (50 Ω microstripline)

The DUT was measured while being mounted on the test jig. Calculation by the relative error correction method was executed by a computer. Measurement was made on a time from inputting of a measurement value of the DUT to the computer until completion of the calculation of a measurement value (estimation value) that would be obtained by measurement using the reference jig.

Mason's method, which represents the overall circuit network with S parameters and performs calculation, took 60 s approximately under condition of three ports and 1601 points. In contrast, the calculation method according to the present disclosure, which uses the virtual T parameters of the virtual first circuit network obtained by converting the first circuit network into a symmetric circuit network, took 30 ms, which indicates significant reduction in calculation time.

The reduction in calculation time and speeding up lead to improvement in processing performance of performing fast property selection in mass production process. The improved processing performance can lead to reduction in investment to equipment such as a property selection machine and a measurement device.

SUMMARY

As described above, conversion into a symmetric circuit by adding a dummy port to an asymmetric circuit network allows accurate calculation of the S parameters of the overall circuit network including the asymmetric circuit network, in a short time, using the virtual T parameters of the symmetric circuit.

The present disclosure is not limited to the above-described embodiment, but can be carried out with various kinds of modifications.

For example, the present disclosure is not limited to the relative error correction method but is widely applicable to a case in which measurement values of an electric component are represented by the second circuit network and corrected by using the first circuit network. For example, the present disclosure is also applicable to a case in which the property of the electric component is measured to calculate the overall property of a configuration in which the electric component is mounted on a circuit board, and a case in which the property of the electric component is measured through a jig to calculate a property from which any influence of the jig is removed. A measurement target is not limited to the electric component, the present disclosure is also applicable to an electric component module on which a plurality of electric components are mounted.

The invention claimed is:

1. A method of deriving an S parameter of an electric circuit network, the method comprising:
a first step of preparing one of a first S parameter and a first T parameter of a first circuit network including an input port and a connection port;
a second step of measuring a second S parameter of a second circuit network; and a third step of calculating, by using one of the first S parameter and the first T parameter prepared in the first step and the second S parameter measured in the second step, an overall S parameter of an overall circuit network in which the connection port of the first circuit network is connected with the second circuit network, wherein:

the first circuit network is an asymmetric circuit network in which the number of the input ports is smaller than the number of the connection ports, and the third step calculates, on an assumption of a virtual first circuit network obtained through conversion of the first circuit network into a symmetric circuit network by adding a dummy port to the input port side of the first circuit network, the overall S parameter corresponding to the input port among virtual S parameters of a virtual overall circuit network in which the connection port of the virtual first circuit network is connected with the second circuit network, as the overall S parameter of the overall circuit network by using a parameter corresponding to the dummy port among virtual T parameters of the virtual first circuit network as an unknown value.

2. A method of deriving an S parameter of an electric circuit network, the method comprising:

a first step of preparing one of a first S parameter and a first T parameter of a first circuit network including an input port and a connection port;

a second step of measuring a second S parameter of a second circuit network; and a third step of calculating, using one of the first S parameter and the first T parameter prepared in the first step and the second S parameter of the second circuit network measured in the second step, an overall S parameter of an overall circuit network in which the connection port of the first circuit network is connected with the second circuit network, wherein:

the first circuit network is an asymmetric circuit network in which the number of the input ports is larger than the number of the connection ports, and the third step calculates, on an assumption of a virtual first circuit network obtained through conversion of the first circuit network into a symmetric circuit network by adding a first dummy port to the connection port side of the first circuit network, and a virtual second circuit network obtained by adding a second dummy port connected with the first dummy port to the second circuit network, the overall S parameter corresponding to the input port among virtual S parameters of a virtual overall circuit network in which the connection port of the virtual first circuit network and the first dummy port are connected with the virtual second circuit network, as the overall S parameter of the overall circuit network by using a virtual T parameter of the virtual first circuit network as an unknown value and setting zero to a parameter corresponding to the second dummy port among virtual S parameters of the virtual second circuit network.

* * * * *